United States Patent [19]

Honebrink et al.

[11] 4,053,872

[45] Oct. 11, 1977

[54] THERMOPLASTIC OPTICAL RECORDING MEDIUM USING IR WAVE LENGTH

[75] Inventors: Roger Wayne Honebrink; Leslie Harold Johnson; David Shih-Fang Lo, all of St. Paul, Minn.

[73] Assignee: Sperry Rand Corporation, New York, N.Y.

[21] Appl. No.: 638,241

[22] Filed: Dec. 8, 1975

[51] Int. Cl.$^2$ .................... G11C 11/46; G01D 15/02
[52] U.S. Cl. ........................ 340/173 TP; 346/77 E; 346/151
[58] Field of Search .............. 340/173 TP; 346/151, 346/77 E

[56] References Cited

U.S. PATENT DOCUMENTS 3,519,422  5/1970  Gaynor et al. ............. 340/173 TP

OTHER PUBLICATIONS

Butter et al., Thermoplastic Helegraphic Recording of Binary Patterns in PLZT Line Composer, IEEE Transactions on Computers, vol. C-24, No. 4, Apr. 1975, pp. 402-406.

Chang et al., High-Resolution Thermoplastic Recording, IBM Technical Disclosure Bulletin, vol. 9, No. 12, May 1967, p. 1821.

Primary Examiner—Stuart N. Hecker
Attorney, Agent, or Firm—Kenneth T. Grace; Marshall M. Truex

[57] ABSTRACT

An apparatus for and a method of recording or writing optical data into a thermoplastic layer is disclosed. The apparatus includes a layer of photoconductive material that is photoconductively responsive to a data containing light beam having a wave length below the infrared (IR) range and a layer of thermoplastic material that is thermoplastically responsive to a light beam having a wave length within the IR range. In practicing the method of the present invention, the electrically charged apparatus is exposed to a data-bearing light beam having a wave length below the IR range for selectively exposing, i.e., electrically charging, the photoconductive layer. Next, the apparatus is exposed to a light beam having a wave length within the IR range for heating the thermoplastic film and thermally permitting the selective electric charge in the photoconductive layer to distort the surface of the thermoplastic layer, and, accordingly, writing into the thermoplastic layer the optical data that was contained within the data-bearing light beam.

4 Claims, 10 Drawing Figures

ERASE (T = $T_E$ > $T_D$)

CHARGE

EXPOSE

DEVELOP (T = $T_D$)

ERASE ($T = T_E > T_D$)

CHARGE

EXPOSE

DEVELOP ($T = T_D$)

THERMOPLASTIC OPTICAL RECORDING MEDIUM USING IR WAVE LENGTH

BACKGROUND OF THE INVENTION

In the prior art, it is known that optical information may be recorded or written in a thermoplastic layer by controlling the three parameters of the surface charge density, the light density and the temperature of the thermoplastic layer — see the A. E. Jvirblis, et al., U.S. Pat. No. 3,795,514. More recently, work has indicated that holographic recording on thermoplastic films may be the basis of future high-density holographic storage of analog and digital data. See the publications "Holographic Recording on Thermoplastic Films," T. C. Lee, *Applied Optics*, Volume 13, No. 4, April, 1974, pp. 888–895, and "An Experimental Read-Write Holographic Memory," W. C. Stewart, et al., *RCA Review*, Volume 34, March, 1973, pp. 3–44.

In the past, it was known to apply thermal energy to selective recording areas of a thermoplastic layer using a matrix array of resistive heating elements. This configuration requires at least two electrical connections per selective recording area. Accordingly, in an optical data storage system of reasonable size, the number of electrical connections would be near prohibitive with a significant portion of the area of the thermoplastic layer being required for such electrical connections. In the L. D'Auria U.S. Pat. No. 3,878,515 there is disclosed a thermoplastic storage system wherein each recording area of the thermoplastic layer along a given row is coupled to a pair of electrical busbars, each recording area including an electrical heating element and a photoconducting switching element. When the photoconducting switching element is exposed to a beam of light, the two associated busbars are intercoupled causing current to flow through the electrical heating element and, accordingly, to apply thermal energy to the associated recording area. However, this most recent system still requires that an inordinate portion or amount of the area of the thermoplastic layer be utilized by the busbars and related electrical apparatus including the photoconducting switching element. The present invention is directed toward an apparatus for and a method of eliminating substantially all direct electrical connections to the recording area and to use light beams for the selective writing into the one selected recording area in the thermoplastic layer.

DESCRIPTION OF THE PREFERRED EMBODIMENTS

Figure 1:
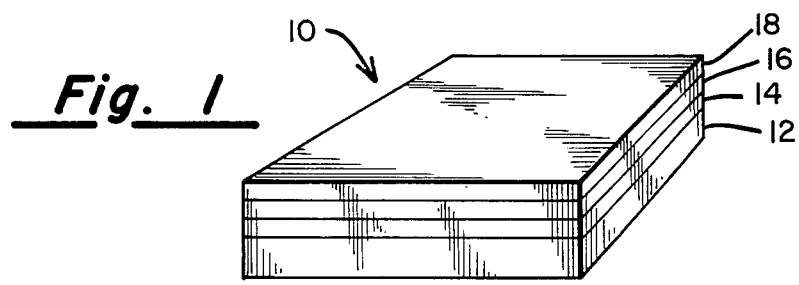
FIG. 1 is a perspective view of the thermoplastic storage medium of the present invention.

With particular reference to FIG. 1 there is presented a perspective view of the thermoplastic optical recording medium 10 of the present invention. Thermoplastic storage medium 10 consists of an integral, laminated structure formed of substrate 12 that is a planar, dimensionally stable substrate of an optically transparent material, e.g., optical glass, of 10 milimeters (mm) in thickness. Next, upon substrate 12 there is sputtered a layer 14 of optically transparent conductive material, e.g., gold of 1.0 micron ($\mu$m) in thickness. Next, upon conductive layer 14, there is sputtered a photoconductive layer 16 of photoconductive material that is optically responsive to light that is of a wavelength that is below the IR range, e.g., selenium (Se) of 1.0 $\mu$m in thickness. Lastly, upon photoconductive layer 16 there is coated a thermoplastic layer 18 of a thermoplastic material that is thermally responsive to light that is of a wavelength that is in the IR range, e.g., Staybelite Ester 10, Hercules Powder Co., of 1.0 $\mu$m in thickness.

Figure 2:
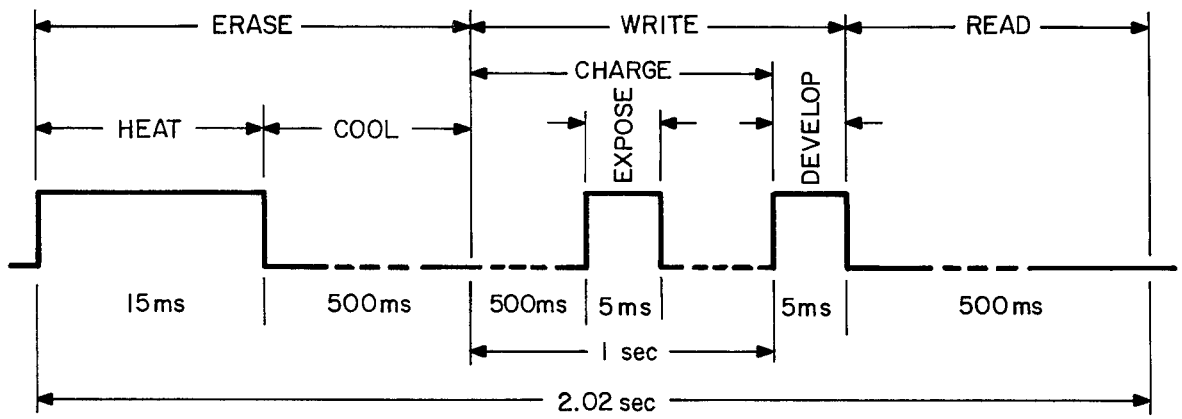
FIG. 2 is an illustration of a typical timing diagram that may be utilized in practicing the present invention.
Figure 3A:
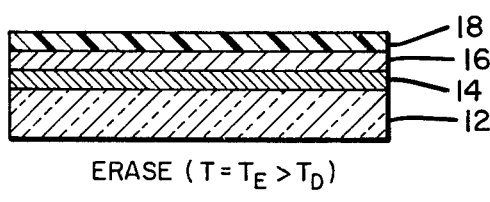
FIGS. 3a, 3b, 3c, 3d are diagramatic illustrations of the effects of the erase-charge-expose-develop operations of FIG. 2 upon the thermoplastic storage medium of FIG. 1.
Figure 3B:
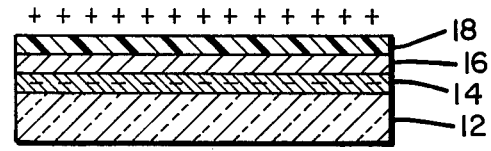
Figure 3C:
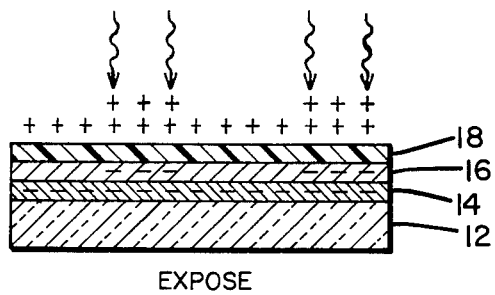
Figure 3D:
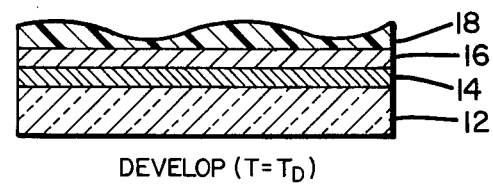

With particular reference to FIG. 2 there is presented a timing diagram of the erase-write-read operation that may be employed in the utilization of the thermoplastic storage medium 10 of FIG. 1. With particular reference to FIGS. 3a, 3b, 3c, 3d there are presented the diagramatic illustrations of the effects of the erase-charge-expose-develop operations of FIG. 2 upon the thermoplastic storage medium 10 of FIG. 1. Further, a block diagram and a diagramatic illustration of a thermoplastic storage system that would implement the present invention, as shown in more detail in FIGS. 1, 2, 3a, 3b, 3c, 3d, are presented in FIGS. 4 and 5, respectively.

Figure 4:
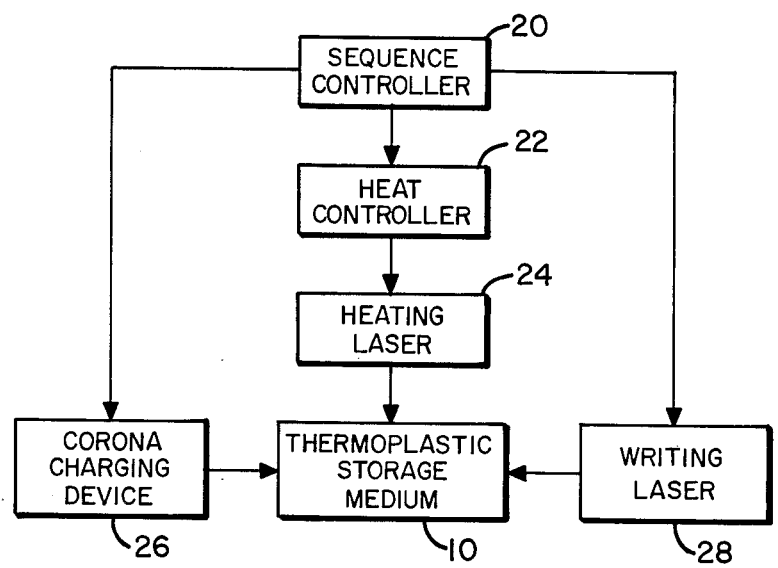
FIG. 4 is a block diagram of a thermoplastic storage system that may be utilized to practice the present invention.

Using FIG. 2 as an illustration of a typical timing diagram of the erase-write-read cycle employed by the present invention, sequence controller 20 — see FIG. 4 — initiates the sequence by coupling to heat controller 22 an appropriate signal that controls heating laser 24 to subject thermoplastic layer 18 of thermoplastic storage medium 10 to a heating light beam that is within the IR range having a wavelength preferably greater than 10,000 A or 1.0 $\mu$m, e.g., a $CO_2$ laser of 1.06 $\mu$m. Laser 24 couples to thermoplastic storage medium 10 an erasing energy $E_E$ that induces in thermoplastic layer 18 a temperature $T_E$ that is of a sufficient magnitude to erase any previously written information. This heating operation of, e.g., 15 miliseconds (ms) is then followed by a cooling cycle of, e.g., 500 ms after which time the erase operation is completed and following which the write operation may be initiated. At this time the status of the thermoplastic storage medium 10 is as diagramatically illustrated in FIG. 3a.

Next, sequence controller 20 activates corona charging device 26 — which is not illustrated in FIG. 5 but may be similar to that of the hereinabove referenced A. E. Jvirblis, et al., U.S. Pat. — which subjects the surface of thermoplastic storage medium 10 to a uniform static electrical charge density for a duration of, e.g., 1 second (sec). The status of the thermoplastic storage medium 10 is, at this time, diagramatically illustrated by FIG. 3b.

Next, at a delay after the initialization of the charging sequence of, e.g., 500 ms, sequence controller 20 energizes writing laser 28 for subjecting or exposing thermoplastic storage medium 10 to a data-bearing light beam for a period of, e.g., 5 ms. Writing laser 28 projects upon thermoplastic storage medium 10 the data-bearing light beam that is below the IR range having a wavelength of preferably less than 6,000 angstroms (A) or 0.6 μm, e.g., an argon laser of 0.49 μm. Writing laser 28 selectively illuminates or exposes a selected one recording area within thermoplastic storage medium 10 with a data-bearing light beam that is of a wavelength that is below the IR range for selectively spatially altering the uniform charge density on the surface of the one selected recording area to a spatially varying charge density that is representative of the data borne by the data-bearing light beam. The status of the thermoplastic storage medium 10 after the termination of the expose operation is as diagramatically illustrated in FIG. 3c.

After the termination of the charging sequence of, e.g., 1 second and still within the writing sequence, sequence controller 20 again activates heat controller 22 which, in turn, couples to heating laser 24 an appropriate control signal causing heating laser 24 to couple to the one selected memory area of thermoplastic storage medium 10 a developing light beam that may be similar to that of the heating light beam utilized during the erase cycle. However, during the developing cycle the developing energy $d_D$ due to the IR heating laser 24 is controlled for generating within thermoplastic storage medium 10 a developing temperature $T_D$ that is of a magnitude that is substantially less than the erasing temperature $T_E$ utilized during the erasing cycle, i.e., $$T_E > T_D.$$

Now, after the termination of the developing cycle, and, accordingly, the write cycle, the spatially varying charge density to which thermoplastic storage medium 10 had been previously subjected to by means of the data-bearing light beam from writing laser 28 has caused the surface of the thermoplastic layer 18 of thermoplastic storage medium 10 to distort in a pattern that conforms thereto whereby the data borne by the data-bearing light beam from writing laser 28 has now been written into thermoplastic storage medium 10. The status of thermoplastic storage medium 10 at this time is as diagramatically illustrated in FIG. 3d.

After the erase-write sequence, as illustrated in FIG. 2, the one selected memory area into which the data borne by data-bearing light beam from writing laser 28 has been written into the one selected memory area of thermoplastic storage medium 10, the data written therein may now be read out during, e.g., a 500 ms reading cycle. After this now-completed erase-writing sequence, the one selected memory area of thermoplastic storage medium 10 into which the data from data-bearing laser beam 28 has been written, such data may be immediately read out during a e.g., 500 ms reading cycle, or may be subjected to successive read cycles, or, alternatively, such erase-write-read sequence may be immediately followed by one or more successive erase-write-read sequences in the same or other selected memory areas of thermoplastic storage medium 10 — see the copending patent application of D. S. Lo having a Ser. No. 537,889 and filed Jan. 2, 1975, now U.S. Pat. No. 3,995,280.

Figure 5:
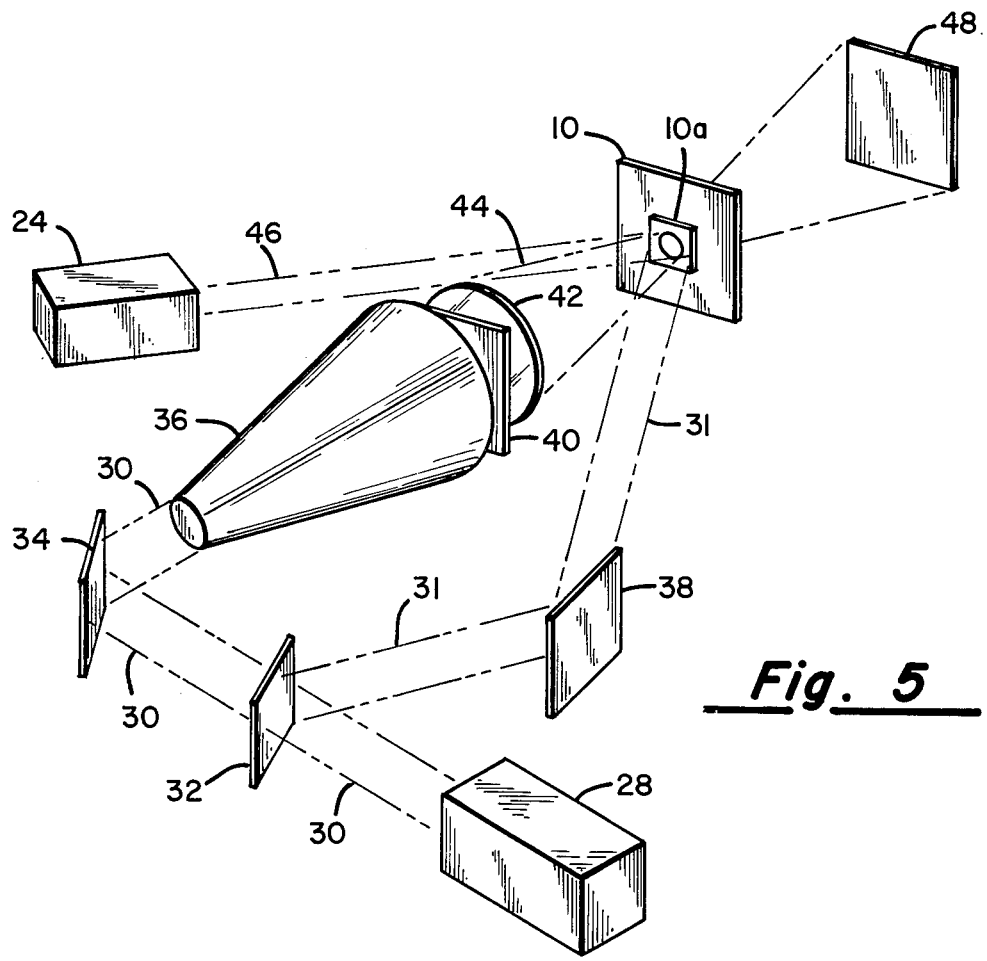
FIG. 5 is a diagramatic illustration of a thermoplastic storage system that may be utilized to implement the system of FIG. 4.

With particular reference to FIG. 5 there is presented a diagramatic illustration of an optical system that may be utilized to practice the present invention. In this configuration, writing laser 28 provides a primary beam 30 of collimated light which impinges upon beam splitter 32 permitting a portion of the light beam 30 to pass therethrough to impinge upon mirror 34 and to be focused upon beam expander 36. Beam splitter 32 also generates a reference beam 31 which upon impinging upon mirror 38 is focused upon thermoplastic storage medium 10 at the one selected memory area 10a. Beam expander 36 expands light beam 30 to encompass a data bearing medium 40 which contains the information or data that is to be written into memory area 10a. Lens 42 then focuses the data- or information-bearing beam 44 upon the one selected memory area 10a of thermoplastic storage medium 10. Also illustrated is heating laser 24 that provides a heating beam 46 which also impinges upon the one selected memory area 10a of thermoplastic storage medium 10. Also illustrated is a signal detector 48 that is oriented along the optical axis of the data-bearing information beam 44 on the far side of thermoplastic storage medium 10. Not illustrated for purposes of clarity is the corona charging device 26 — see FIG. 4 — but which may be of many well-known designs such as that of the hereinabove referenced A. E. Jvirblis, et al., patent.

Figure 6:
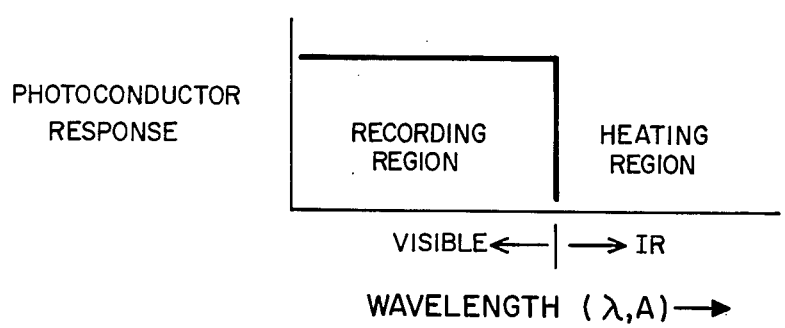
FIG. 6 is a graph of idealized photoconductor response that is a basis for the present invention.
Figure 7:
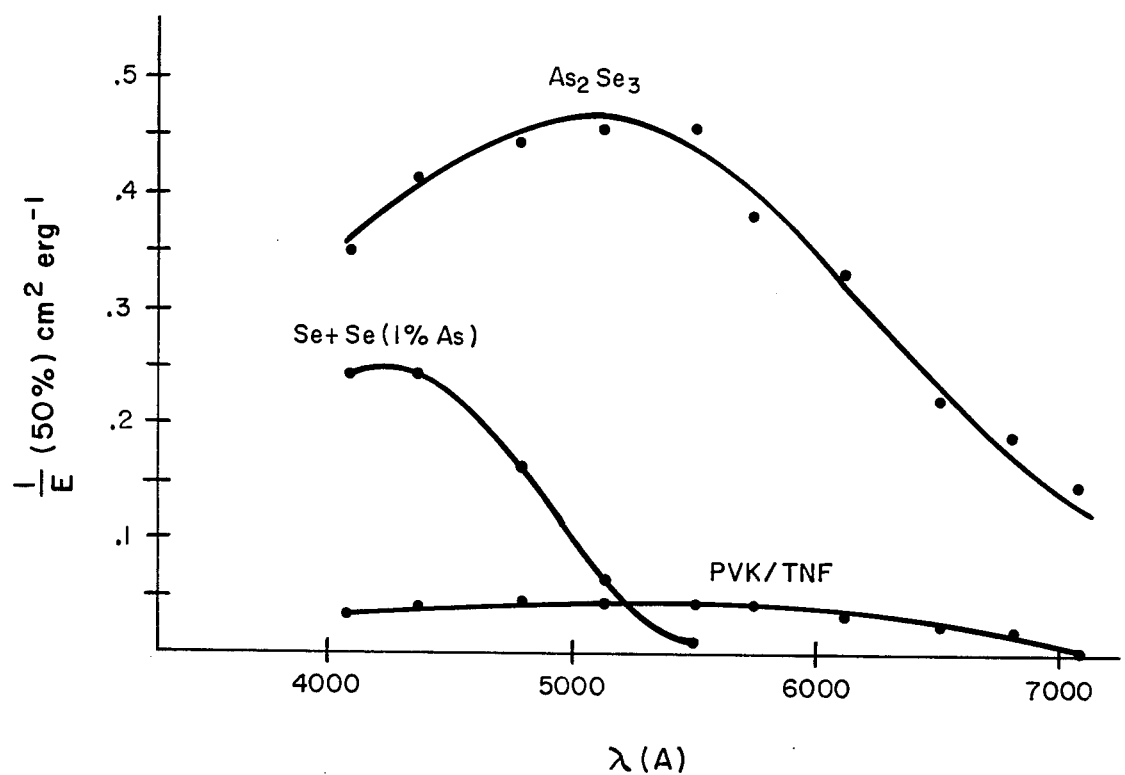
FIG. 7 is a graph of spectral response for four typical photoconductive materials.

As stated hereinabove, thermoplastic storage medium 10 of the present invention utilizes a layer of photoconductive material, e.g., selenium, that is optically responsive to light that is of a wavelength that is below the IR range, e.g., an argon laser of a wavelength of 0.4 μm, in combination with a layer of thermoplastic material that is thermally responsive to light that is of a wavelength that is in the IR range, e.g., a $CO_2$ laser of a wavelength of 1.6 μm. With particular reference to FIG. 6 there is presented a graph of an idealized photoconductor response curve for the photoconductive layer 16 of the thermoplastic storage medium 10 of FIG. 1. If the photoconductive layer 16 has the idealized response curve illustrated in FIG. 6, it can be seen that the photoconductive layer 16 responds to visible light, e.g., the argon laser of 0.49 μm, such as provided by the writing laser 28 of FIG. 4, that is utilized during the writing operation — see FIG. 2 — but is insensitive to IR light, e.g., the $CO_2$ laser of 1.06 μm, used for the heating operation of the erase cycle and the developing operation of the write cycle — see FIG. 2. Accordingly, selective heating of a selected memory area 10a of thermoplastic storage medium 10 may be accomplished with an IR laser beam rather than with conventional resistance heating such as discussed hereinabove. Photoconductive layer 16 of thermoplastic storage medium 10 may be formed of any form of conductive material that has a low-pass or a bandpass response characteristic, e.g., such as the hereinabove preferred selenium. With particular reference to FIG. 7 there is presented an illustration of a graph of the spectral response of four typical photoconductive materials. These data are plotted versus the ordinate axis which is representative of photosensitivity expressed as the reciprocal of the optical energy per square centimeter (cm) that is required to discharge the photoconductive material to one-half initial voltage versus the wavelength of the laser beam in angstroms (A).

What is claimed is:
1. An integral, laminated medium for the optical recording of data in a thermoplastic film, comprising:
   a planar, dimensionally stable substrate;
   a layer of conductive material affixed to and continuous over the top surface of said layer of conductive material and which is only optically responsive to light that is of a wavelength that is below the IR range; and,
   a layer of thermoplastic material affixed to and continuous over the top surface of said layer of photo- conductive material and which is only thermally responsive to light that is of a wavelength that is in the IR range.

2. An integral, laminated medium for the optical recording of data in a thermoplastic film, comprising:
   a planar, dimensionally stable substrate of an optically transparent material;
   a layer of optically transparent conductive material affixed to and continuous over one planar surface of said substrate;
   a layer of photoconductive material affixed to and continuous over the top surface of said layer of conductive material and which is only optically responsive to light that is of a wavelength that is below the IR range; and,
   a layer of thermoplastic material affixed to and continuous over the top surface of said layer of photoconductive material and which is only thermally responsive to light that is of a wavelength that is in the IR range.

3. A thermoplastic storage system, comprising:
   a thermoplastic storage medium having a surface that is adapted to store optical data in selected recording areas of said surface;
   means for uniformly electrically charging the surface of only a selected one of said recording areas with a light beam having a wavelength below the IR range;
   means selectively illuminating only said one selected recording area with a data-bearing light beam that is of a wavelength that is below the IR range for selectively spatially altering the uniform charge density on only the surface of said one selected recording area in a spatially varying charge density that is representative of the data borne by said data-bearing light beam; and,
   means selectively illuminating only the surface of said one selected recording area with a light beam that is in the IR range to couple thermal energy to only said recording area for distorting the surface of the thermoplastic storage medium in only said one selected recording area in a pattern that conforms to said spatially varying charge density and storing therein the data borne by said data-bearing light beam.

4. A thermoplastic storage system, comprising:
   thermoplastic storage means having a surface that is adapted to store optical data in selected recording areas of said surface;
   charging means for uniformly electrically charging the surface of only a selected one of said recording areas with a light beam having a wavelength below the IR range;
   developing means selectively illuminating only said one selected recording area with a data-bearing light beam that is of a wavelength that is below the IR range for selectively spatially altering the uniform charge density on only the surface of said one selected recording area in a spatially varying charge density that is representative of the data borne by said data-bearing light beam;
   thermal means selectively illuminating only the surface of said one selected recording area with a light beam that is in the IR range to couple thermal energy to only said recording area for distorting only the surface of the thermoplastic storage medium in only said one selected recording area in a pattern that conforms to said spatially varying charge density and storing therein the data borne by said data-bearing light beam; and,
   said thermal means selectively illuminating only the surface of said one selected recording area with a light beam that is in the IR range to couple thermal energy to said recording area and heating only the surface of the thermoplastic storage medium in only said one selected recording area for erasing the pattern that conforms to said spatially varying charge density and restoring only the surface of the thermoplastic storage medium in only said one selected recording area to its substantially undistorted condition.

* * * * *

UNITED STATES PATENT AND TRADEMARK OFFICE
CERTIFICATE OF CORRECTION

PATENT NO. : 4,053,872
DATED : October 11, 1977
INVENTOR(S) : Roger W. Honebrink, et al It is certified that error appears in the above-identified patent and that said Letters Patent are hereby corrected as shown below:

Column 4, Claim 1, the second paragraph should be formed into two paragraphs to read:

-- a layer of conductive material affixed to and continuous over one planar surface of said substrate;

a layer of photoconductive material affixed to and continuous over the top surface of said layer of conductive material and which is only optically responsive to light that is of a wavelength that is below the IR range; and, --.

Signed and Sealed this

Twenty-eighth Day of February 1978

[SEAL]

Attest:

RUTH C. MASON
*Attesting Officer*

LUTRELLE F. PARKER
*Acting Commissioner of Patents and Trademarks*